United States Patent
Takabe et al.

(10) Patent No.: US 7,651,199 B2
(45) Date of Patent: Jan. 26, 2010

(54) PIEZOELECTRIC ELEMENT, ACTUATOR DEVICE, LIQUID-JET HEAD AND LIQUID-JET APPARATUS

(75) Inventors: Motoki Takabe, Nagano-ken (JP); Koji Sumi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 430 days.

(21) Appl. No.: 11/390,222

(22) Filed: Mar. 28, 2006

(65) Prior Publication Data

US 2006/0268073 A1  Nov. 30, 2006

(30) Foreign Application Priority Data

Mar. 28, 2005  (JP)  ............... 2005-093051

(51) Int. Cl.
  *B41J 2/045*  (2006.01)
  *H01L 41/00*  (2006.01)
  *H02N 2/00*  (2006.01)
(52) U.S. Cl. ......................... 347/68; 310/311
(58) Field of Classification Search ............ 347/70, 347/71; 310/358
  See application file for complete search history.

(56) References Cited

U.S. PATENT DOCUMENTS

| | | | |
|---|---|---|---|
| 6,097,133 A * | 8/2000 | Shimada et al. | ............ 310/358 |
| 6,294,860 B1 | 9/2001 | Shimada et al. | |
| 2003/0076007 A1 | 4/2003 | Murai | |
| 2004/0001120 A1 * | 1/2004 | Murai | ............ 347/68 |
| 2004/0090500 A1 * | 5/2004 | Murai | ............ 347/70 |
| 2004/0155559 A1 | 8/2004 | Ifuku et al. | |

FOREIGN PATENT DOCUMENTS

| | | |
|---|---|---|
| EP | 0 764 992 A1 | 3/1997 |
| EP | 1 329 964 A2 | 7/2003 |
| JP | 2004-042329 B2 | 2/2004 |

* cited by examiner

*Primary Examiner*—Matthew Luu
*Assistant Examiner*—Lisa M Solomon
(74) *Attorney, Agent, or Firm*—Sughrue Mion, PLLC

(57) ABSTRACT

Provided are a piezoelectric element, an actuator device, a liquid-jet head and a liquid-jet apparatus which exhibit excellent displacement characteristics; and the piezoelectric element is configured of a lower electrode, a piezoelectric layer and an upper electrode, in which piezoelectric element the proportion of the (100) planes present in the face surface of the piezoelectric layer to the (100), (110) and (111) planes present therein is not less than 70%, and in which piezoelectric element the proportion of the (100), (110) and (210) planes present in the vertical surface orthogonal to the face surface of the piezoelectric layer to the (100), (110), (210), (111) and (211) planes present therein is not less than 80%.

8 Claims, 7 Drawing Sheets

PIEZOELECTRIC ELEMENT, ACTUATOR DEVICE, LIQUID-JET HEAD AND LIQUID-JET APPARATUS

The entire disclosure of Japanese Patent Application No. 2005-093051 filed Mar. 28, 2005 is expressly incorporated by reference herein.

BACKGROUND OF THE INVENTION

1. Field of the Invention

The present invention relates to a piezoelectric element configured of a lower electrode, a piezoelectric layer and an upper electrode; an actuator device fabricated by providing piezoelectric elements on a substrate with a vibration plate between the group of piezoelectric elements and the substrate; a liquid-jet head for ejecting droplets from nozzle orifices by use of the actuator device; and a liquid-jet apparatus.

2. Description of the Prior Art

An inkjet recording head with the following configuration has been put into practical use. In accordance with the configuration, parts respectively of pressure generating chambers communicating with nozzle orifices are constructed with a vibration plate. The nozzle orifices are those from which ink droplets are ejected. The vibration plate is distorted by piezoelectric elements, and thus ink in each of the pressure generating chambers is pressurized. Accordingly, ink droplets are ejected from each of the nozzle orifices. An inkjet recording head which is constructed, for example, in the following manner is among such inkjet recording heads. An even layer made of a piezoelectric material is formed on the entire surface of the vibration plate by use of a film-forming technique. Then, this layer made of the piezoelectric material is cut into shapes corresponding to the pressure generating chambers by the lithography method. Thereby, the piezoelectric elements are formed respectively in the pressure generating chambers in order that the piezoelectric elements can be independent from one another.

A piezoelectric element with the following type of piezoelectric layer has been among piezoelectric elements used for such inkjet recording heads. The degree of orientation of the (100) planes of the piezoelectric layer constituting the piezoelectric element is defined as being not less than 70%. (See the scope of claims and the like in Japanese Patent Gazette No. 3555682, for example).

Even though, however, the (100) planes present in the face surface of the piezoelectric layer is defined as being oriented with priority given thereto by defining the degree of orientation of the (100) planes, when the face surface of the piezoelectric layer is measured by means of the wide-angled X-ray diffraction method, only components formed perpendicularly to the substrate (the face surface of the piezoelectric layer) can be measured with regard to each of the (111) planes and the (100) planes which are tilted planes of the piezoelectric layer. This brings about a problem that how the actual orientation is can not be distinguished. In addition, the (111), (100) and (211) planes which are tilted planes of the piezoelectric layer does not only distort themselves, but also hinders the piezoelectric layer as a whole from distorting. For this reason, this brings about a problem that the piezoelectric layer including higher proportions respectively of the (111), (100) and (211) planes is poor at displacement characteristics including the amount of displacement.

Incidentally, such problems are not limited to liquid-jet recording heads typified by inkjet recording heads, but are similarly present in other types of piezoelectric elements and other types of actuator devices using piezoelectric elements.

SUMMARY OF THE INVENTION

With the aforementioned conditions taken into consideration, an object of the present invention is to provide a piezoelectric element, an actuator device, a liquid-jet head and a liquid-jet apparatus, each of which exhibits excellent displacement characteristics.

A first aspect of the present invention for the purpose of solving the aforementioned problems is a piezoelectric element characterized by being configured of a lower electrode, a piezoelectric layer and an upper electrode. In addition, the piezoelectric element is characterized in that, with regard to the face surface of the piezoelectric layer, the proportion of the (100) planes present therein to the (100), (110) and (111) planes present therein is not less than 70%. Furthermore, the piezoelectric element is characterized in that, with regard to the vertical surface orthogonal to the face surface of the piezoelectric layer, the proportion of the (100), (110) and (210) planes present therein to the (100), (110), (210), (111) and (211) planes present therein is not less than 80%.

The first aspect makes it possible to realize a piezoelectric layer in which crystals are formed vertically, and which accordingly exhibits excellent displacement characteristics.

A second aspect of the present invention, the piezoelectric element as recited in the first aspect, characterized in that the piezoelectric layer is formed by laminating a plurality of piezoelectric films over each other.

The second aspect makes it possible to obtain a piezoelectric layer having a desired thickness with higher precision.

A third aspect of the present invention is the piezoelectric element as recited in the second aspect, characterized in that the abundance ratio of the (100) planes of first type is not less than 10% of the sum of the (100) planes of second type and the (100) planes of first type. The (100) planes of first type are present in the vertical surface orthogonal to the face surface of the piezoelectric layer. The (100) planes of second type are present in the surface at a predetermined angle to the vertical surface orthogonal to the face surface of the piezoelectric layer.

The third aspect makes it possible to realize a piezoelectric layer exhibiting excellent displacement characteristics.

A fourth aspect of the present invention is the piezoelectric element as recited in the first to the third aspect, characterized in that the piezoelectric layer is made of lead-zirconate-titante.

The fourth aspect makes it possible to obtain a piezoelectric layer having desired crystals which are made of lead-zirconate-titanate.

A fifth aspect of the present invention is an actuator device characterized by being fabricated by providing the piezoelectric elements as recited in any one of the first to the fourth aspects on the substrate with a vibration plate interposed between the group of the piezoelectric elements and the substrate.

The fifth aspect makes it possible to realize an actuator device with piezoelectric elements each exhibiting excellent displacement characteristics.

A sixth aspect of the present invention is a liquid-jet head characterized by including the actuator device as recited in the fifth aspect as liquid-jet means which ejects a liquid from nozzle orifices.

The sixth aspect makes it possible to realize a liquid-jet head exhibiting excellent liquid-jet characteristics by use of piezoelectric elements each exhibiting excellent displacement characteristics.

A seventh aspect of the present invention is a liquid-jet apparatus characterized by including a liquid-jet head as recited in the sixth aspect.

The seventh aspect makes it possible to realize a liquid-jet apparatus exhibiting excellent liquid-jet characteristics.

DESCRIPTION OF THE PREFERRED EMBODIMENTS

Hereinafter, detailed descriptions will be provided for the present invention on a basis of embodiments thereof.

Embodiment 1

Figure 1:
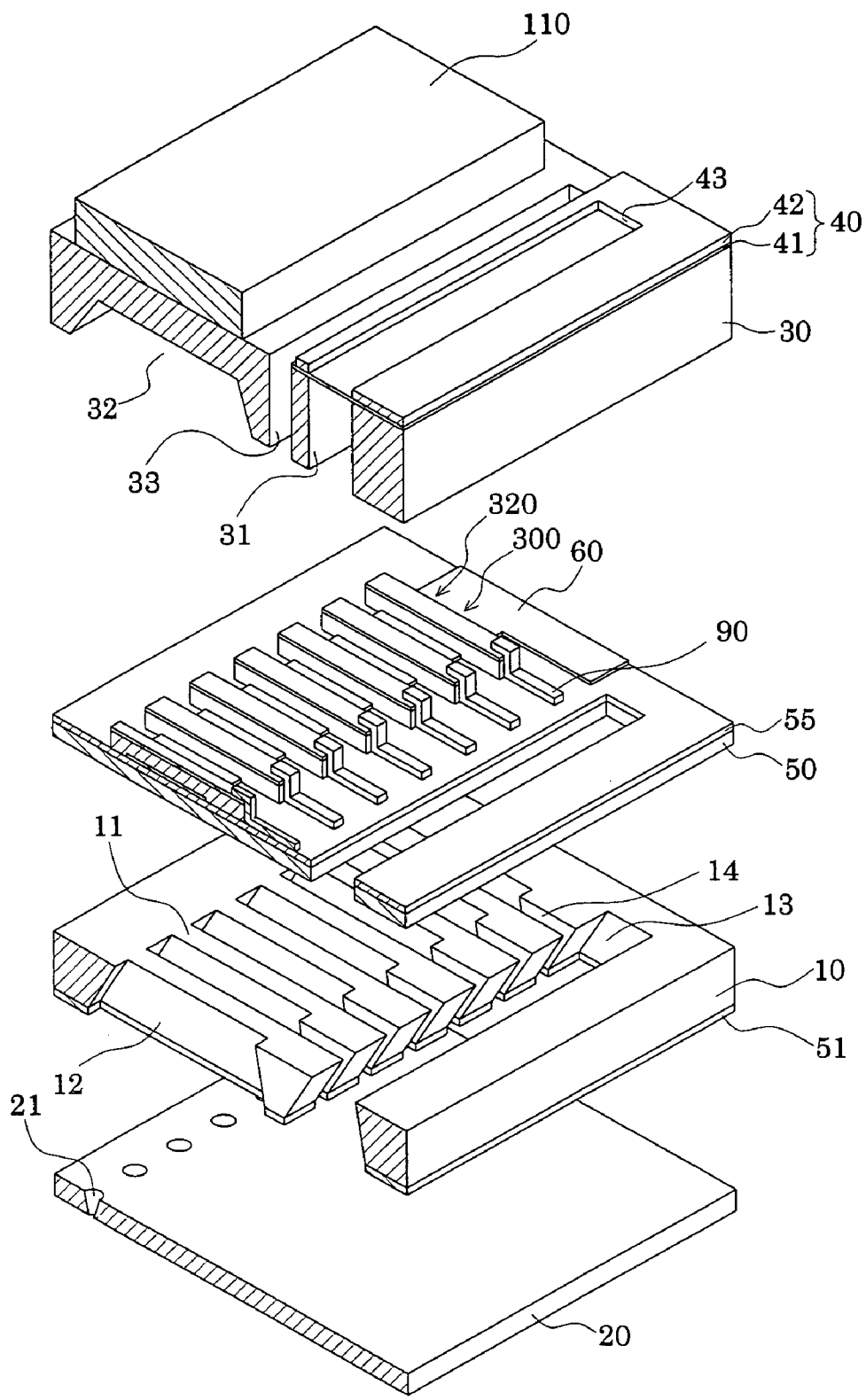
FIG. 1 is an exploded perspective view showing a schematic configuration of a recording head according to Embodiment 1 of the present invention.
Figure 2A:
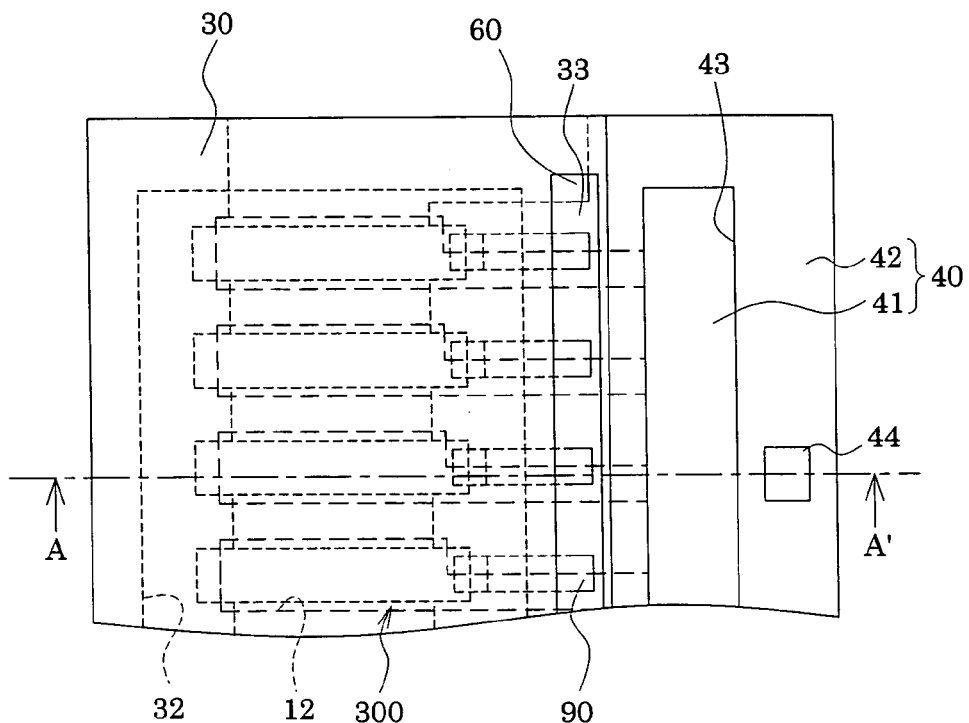
FIGS. 2A and 2B are respectively a plan and a cross-sectional views of the recording head according to Embodiment 1 of the present invention.
Figure 2B:
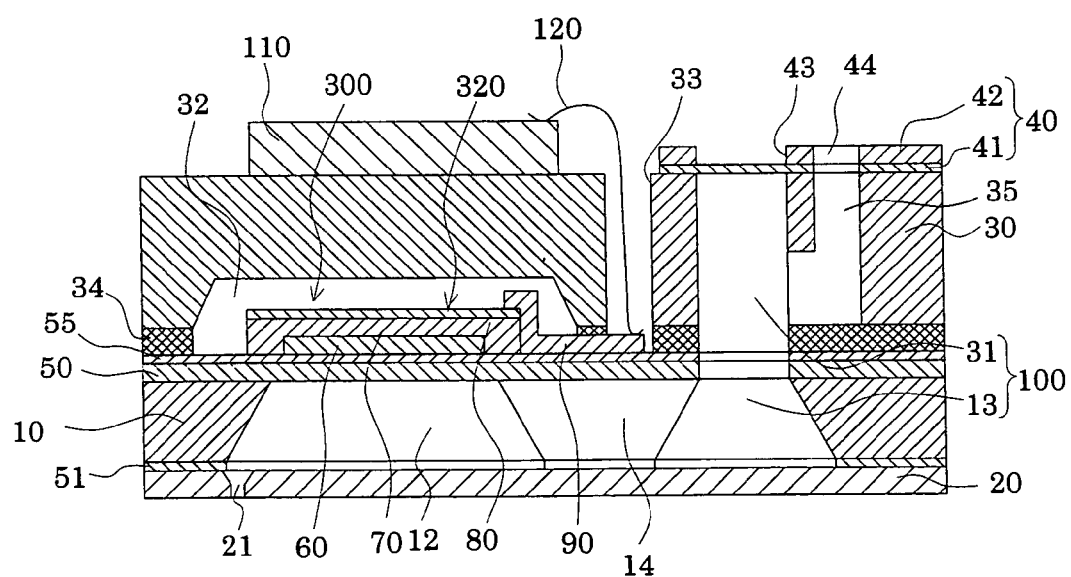

FIG. 1 is an exploded perspective view of an inkjet recording head according to Embodiment 1 of the present invention. FIG. 2A is a plan view of the inkjet recording head shown in FIG. 1, and FIG. 2B is a cross-sectional view of the inkjet recording head taken along the A-A' line of FIG. 2A.

In the case of this embodiment, a passage-forming substrate 10 is made of a single crystal silicon substrate. As illustrated, an elastic film 50 is formed on one surface of the passage-forming substrate 10. The elastic film 50 is made of silicon dioxide beforehand formed by thermal oxidation, and has a thickness of 0.5 to 2 μm.

In the passage-forming substrate 10, a plurality of pressure generating chambers 12 are arranged side-by-side by anisotropically etching the passage-forming substrate 10 from a side which is opposite the surface of the substrate on which the elastic film 50 has been formed. The pressure generating chambers 12 are compartmentalized by compartment walls 11. Outside the pressure generating chambers 12 in the longitudinal direction, a communicating portion 13 is formed. The communicating portion 13 constitutes a part of a reservoir 100 which is a common ink chamber for the pressure generation chambers 12. The communicating portion 13 communicates with one end of each of the pressure generating chambers 12 in the longitudinal direction through its corresponding ink supply path 14. The ink supply paths 14 are formed with widths narrower than those of the pressure generating chambers 12, and thus keep constant the passage resistances of ink flowing from the communicating portion 13 to the respective pressure generating chambers 12.

In addition, a nozzle plate 20 is fixed to an orifice surface of the passage-forming substrate 10 with a protection film 51 interposed in between by use of an adhesive agent, a thermal adhesive film or the like. The protection film 51 is used as a mask while the pressure generating chambers 12 are being formed. In the nozzle plate 20, nozzle orifices 21 are drilled. The nozzle orifices 21 communicate respectively with the pressure-generating chambers 12 at sides of the pressure-generating chambers 12 which are opposite the ink supply paths 14. Incidentally, the nozzle plate 20 is, for example, 0.01 to 1 mm in thickness, and has a linear expansion coefficient, for example, of 2.5 to 4.5[$\times 10^{-6}$/° C.] at a temperature not higher than 300° C. The nozzle plate 20 is made of glass ceramic or stainless steel. One surface of the nozzle plate 20 entirely covers one surface of the passage-forming substrate 10. Thus, the nozzle plate 20 also plays a role of a reinforcement plate for protecting the single crystal silicon substrate from shocks and external forces. In addition, it does not matter whether the nozzle plate 20 is formed of a material having a thermal expansion coefficient almost equal to that of the passage-forming substrate 10. In this case, the heat distortion of the passage-forming substrate 10 and the heat distortion of the nozzle plate 20 are almost similar to each other. For this reason, the passage-forming substrate 10 and the nozzle plate 20 can be easily joined to each other by use of a heat-hardening adhesive agent or the like.

On the other hand, as described above, the elastic film 50 is formed on a surface of the passage-forming substrate 10 which is opposite the orifice surface. The elastic film 50 is made of silicon dioxide, and has a thickness of, for example, approximately 1.0 μm. An insulation film 55 is formed on this elastic film 50 by laminating the insulation film 55 over this elastic film 50. The insulation film 55 is made of zirconia ($ZrO_2$) or the like, and its thickness is approximately 0.4 μm. Furthermore, a lower electrode film 60, piezoelectric layers 70 and upper electrode films 80 are formed on this insulation film 55 by laminating them over each other on the insulation film 55 by use of the process described below. The lower electrode film 60, one piezoelectric layer 70 and one upper electrode film 80 constitute each of piezoelectric elements 300. The lower electrode film 60 is made of iridium (Ir), and is, for example, approximately 0.1 to 0.5 μm in thickness. Each of the piezoelectric layers 70 is made of lead-zirconate-titanate (PZT) or the like, and has a thickness of, for example, approximately 1.0 μm. Each of the upper electrodes 80 is made of gold, platinum, iridium or the like, and has a thickness of, for example, approximately 0.05 μm. In this regard, the piezoelectric element 300 is a portion including the lower electrode film 60, one piezoelectric layer 70 and one upper electrode film 80. In general, the piezoelectric element 300 is configured in the following manner. One of the two electrodes of the piezoelectric element 300 is used as a common electrode. The other of the two electrodes of the piezoelectric element 300 and the piezoelectric layer 70 are patterned in each of the pressure generating chambers 12. In this regard, piezoelectric strain occurs due to application of a voltage to the two electrodes in a portion constituted of a patterned piezoelectric layer 70 and a corresponding patterned one of the two electrodes. This portion is called a "piezoelectric active portion" 320. In the case of this embodiment, the lower electrode film 60 is used as a common electrode for the piezoelectric elements 300, and the upper electrode films 80 are used as individual electrodes of the piezoelectric elements 300. However, it does not matter whether the use is the other way round for conveniencing the arrangement of a drive circuit and interconnects. In both cases, the piezoelectric active portions are formed respectively for the pressure generating chambers 12. In addition, a combination of one piezoelectric element 300 and a vibration plate is called a "piezoelectric actuator." The vibration plate provides a displacement depending on a drive of the piezoelectric element 300. Incidentally, in the aforementioned example, the elastic film 50 and the insulation film 55 function jointly as the vibration plate. The lower electrode film 60 constituting the piezoelectric element 300 can be also designed to perform the function of the vibration plate.

In addition, as a material for the piezoelectric layers 70, for example, a piezoelectric material (ferroelectric material) and what is obtained by adding a metallic oxide to this material are desirable. Examples of such a piezoelectric material (ferroelectric material) include lead-zirconate-titanate (PZT). Examples of such a metallic oxide includes niobium oxide, nickel oxide and magnesium oxide. Specifically, lead-titanate ($PbTiO_3$), lead-zirconate-titanate (Pb (Zr, Ti) $O_3$), lead-zirconate ($PbZrO_3$), lead-lanthanum-titanate ((Pb, La) $TiO_3$), lead-lanthanum-zirconate-titanate ((Pb, La) (Zr, Ti) $O_3$), lead-zirconium-titanate-magnesium-niobate (Pb (Zr, Ti) (Mg, Nb) $O_3$) or the like can be used. The piezoelectric layers 70 are formed with a thickness which is small enough to prevent cracks from occurring in the piezoelectric layers 70 in the manufacturing process, and which is large enough to enable the piezoelectric layers 70 to exhibit their displacement characteristic sufficiently. In the case of this embodiment, the piezoelectric layers 70 are formed with a thickness of, for example, approximately 0.5 to 2 μm.

In addition, in the case of the piezoelectric layer 70 according to this embodiment, the proportion of the (100) planes present in the face surface to the (100), (110) and (111) planes present in the same face surface (hereinafter referred to as the "degree of orientation of the face surface") is not less than 70%. In this respect, the "degree of orientation of the face surface" means ratios of diffraction intensities which appear when the piezoelectric layer 70 is measured by means of the wide-angle X-ray diffraction method. Specifically, when the face surface of the piezoelectric layer 70 is measured by means of the wide-angled X-ray diffraction method, peaks of diffraction intensities corresponding respectively to the (100), (110) and (111) planes appear. The "degree of orientation of the face surface" means a proportion of the peak intensity corresponding to the (100) planes to the sum of the peak intensities respectively of the (100), (110) and (111) planes. In the case of this embodiment, the degree of orientation of the (100) planes present in the face surface of the piezoelectric layer 70 is not less than 70%. This means that the (100) planes therein are oriented with priority given thereto.

Furthermore, in the case of the piezoelectric layer 70 according to this embodiment, the peak intensity of the (100) planes present in the face surface is 100 cps. Accordingly, this makes it possible for the piezoelectric layer 70 to exhibit excellent displacement characteristics.

Figure 3:
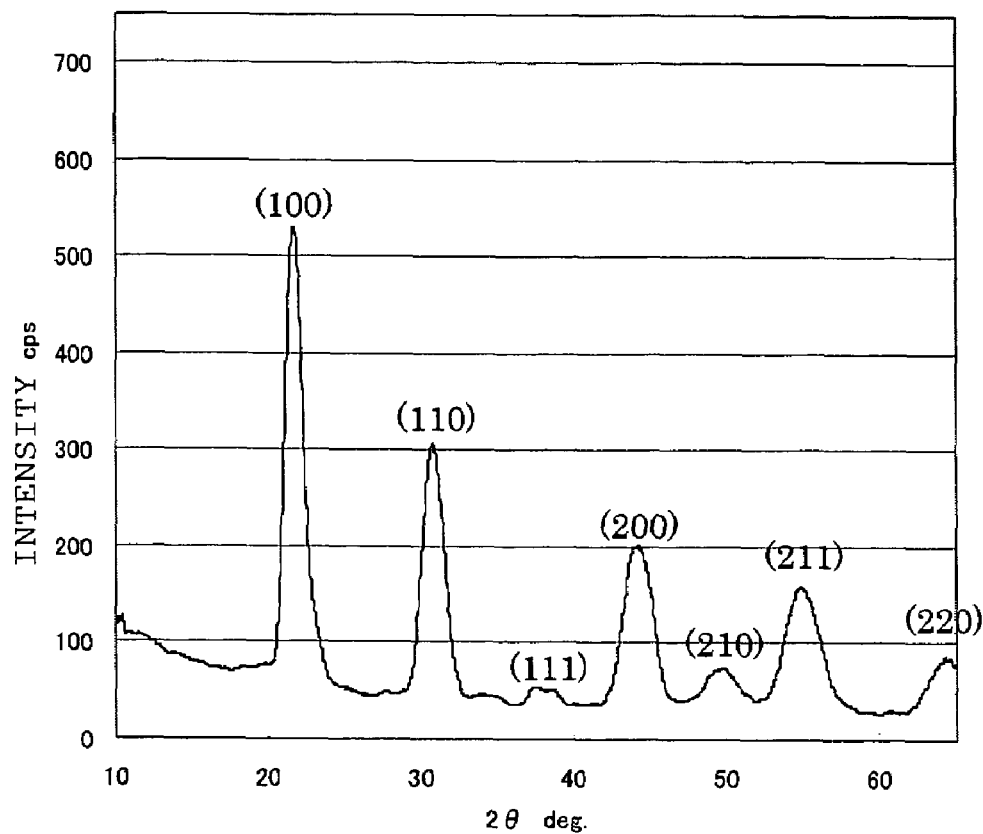
FIG. 3 is a graph showing degrees of orientations of a vertical surface of a piezoelectric layer according to Embodiment 1 of the present invention.

Likewise, in the case of the piezoelectric layer 70 according to this embodiment, the proportion of the (100), (110) and (210) planes present in the vertical surface orthogonal to the face surface to the (100), (110), (210), (111) and (211) planes present in the same vertical surface (hereinafter referred to as the "degree of orientation of the vertical surface") is not less than 80%. In this regard, the "degree of orientation of the vertical surface" means ratios of diffraction intensities which appear when the piezoelectric layer 70 is measured by means of the in-plane X-ray diffraction method. Specifically, when the vertical surface of the piezoelectric layer 70 is measured by means of the in-plane X-ray diffraction method, peaks of diffraction intensities corresponding to the (100), (110), (210), (111) and (211) planes appear, as shown in FIG. 3. The peaks of diffraction intensities of the (100), (110) and (210) planes correspond to the peak of diffraction intensity of the (100) planes present in the face surface, which peak reads when the face surface is measured by means of the wide-angled X-ray diffraction method. The (111) and (211) planes are tilted planes. The "degree of orientation of the vertical surface" means the proportion of the peak intensities corresponding to the (100), (110) and (210) planes to the sum of peak intensities corresponding to the (100), (110), (210), (111) and (211) planes.

If the degree of orientation of the (100), (110) and (210) planes present in the vertical surface of the piezoelectric layer 70 is not less than 80%, this makes it possible for crystals to grow vertically, and accordingly for the piezoelectric layer 70 to exhibit excellent displacement characteristics. Specifically, even if the degree of orientation of the face surface of the piezoelectric layer 70 is merely adjusted, the (111), (110) and (211) planes which are tilted planes of the piezoelectric layer 70 are not taken into consideration. Accordingly, excellent displacement characteristics can not be obtained. Incidentally, the (111), (110) and (211) planes, which are tilted planes of the piezoelectric layer 70, do not distort themselves, but also hinders the piezoelectric layer 70 as a whole from distorting. In addition, even though the face surface of the piezoelectric layer 70 is measured by means of the wide-angled X-ray diffraction method, the (111) and (211) planes can be measured by mean of the method, whereas the (111) and (211) planes can be measured by means of the in-plane X-ray diffraction method. With this taken into consideration, the proportion of the (100), (110) and (210) planes present in the vertical surface orthogonal to the face surface of the piezoelectric layer 70 to the (100), (110), (210), (111) and (211) planes present in the same vertical surface is defined as being not less than 80%, when the face surface of the piezoelectric layer 70 is measured by means of the in-plane X-ray diffraction method. Accordingly, this makes it possible to obtain excellent displacement characteristics by paying attention to the (111) and (211) planes which are tilted planes of the piezoelectric layer 70.

Moreover, the piezoelectric layer 70 is formed in a way that the abundance ratio of the (100) planes of first type is not less 10% than the sum of the (100) planes of second type and the (100) planes of first type. Accordingly, this makes it possible to improve the displacement characteristics. In this case, the (100) planes of first type are present in the vertical surface orthogonal to the face surface of the piezoelectric layer 70. The (100) planes of second type are present in the surface at a predetermined angle to the vertical surface orthogonal to the face surface of the piezoelectric layer 70.

Furthermore, a lead electrode 90 is connected to each of the upper electrode films 80 which are individual electrodes for the respective piezoelectric elements 300. The lead electrode 90 is drawn out from the vicinity of an end of the corresponding ink supply path 14, and is extended to the top of the insulation film 55. The lead electrode 90 is made of, for example, gold or the like.

A protection plate 30 is joined to the top of the passage-forming substrate 10 over which such piezoelectric elements 300 are formed, in other words, above the lower electrode film 60, the insulation films 55 and the lead electrodes 90, with an adhesive agent 34 interposed between the protection plate 30 and the passage-forming substrate 10. The protection plate 30 includes a reservoir portion 31 constituting at least a part of a reservoir 100. In the case of this embodiment, this reservoir portion 31 is formed in a way that the reservoir portion 31 penetrates through the protection plate 30 in the thickness direction, and in a way that the reservoir portion 31 extends in a direction which is the same as the width direction of the pressure generating chambers 12. The reservoir portion 31 communicates with the communication portion 13 of the passage-forming substrate 10, and thus constitutes the reservoir 100 which is used as a common ink chamber for the pressure generating chambers 12.

Moreover, a piezoelectric element holding portion 32 is provided to a region of the protection plate 30, which region is opposite the piezoelectric elements 300. The piezoelectric element holding portion 32 has a cavity large enough not to hinder piezoelectric elements 300 from moving. It suffices if the protection plate 30 has a cavity large enough not to hinder the piezoelectric elements 300 from moving. It does not matter whether or not the cavity is sealed up.

It is desirable that a material having a thermal expansion coefficient equal to that of the passage forming substrate 10 be used for such a protection plate 30. Examples of the material include glass and ceramics. In the case of this embodiment, the protection plate 30 is formed of a single crystal silicon substrate which is the same material the passage forming substrate is formed of.

Furthermore, the protection plate 30 is provided with a through-hole 33 which penetrates through the protection plate 30 in the thickness direction. Moreover, the vicinities of the ends of the lead electrodes 90 drawn out respectively from the piezoelectric elements 300 are set up in a way that the vicinities are exposed to the through-hole 33.

Likewise, a drive circuit 110 is fixed to the top of the protection substrate 30. The drive circuit 110 drives the piezoelectric elements 300 arranged side-by-side. For example, a circuit plate, a semiconductor integrated circuit (IC) or the like can be used as this drive circuit 110. Additionally, the drive circuit 110 and each of the lead electrodes 90 are electrically connected with each other through a connecting wiring 120. The connecting wiring 120 is made of a conductive wire such as a bonding wire.

In addition, a compliance plate 40 is joined to the top of the protection plate 30. The compliance plate 40 is configured of a sealing film 41 and a fixed plate 42. In this regard, the sealing film 41 is made of a flexible material with a lower rigidity (for example, a polyphenylen sulfide (PPS) film with a thickness of 6 μm.) One end of the reservoir portion 31 is sealed up by this sealing film 41. Furthermore, the fixed plate 42 is formed of a hard material such as a metal (for example, stainless steel (SUS) or the like with a thickness of 30 μm). A region of this fixed plate 42, which region is opposite the reservoir 100, is an opening portion 43 which is obtained by completely removing a portion corresponding to the region from the fixed plate 42 in the thickness direction. Accordingly, one end of the reservoir 100 is sealed up only by the sealing film 41 which is flexible.

An ink introducing port 44 for supplying ink to the reservoir 100 is formed in a part of the compliance plate 40. The part of the compliance 40 is located outside this reservoir 100, and the location corresponds roughly to the center of the reservoir 100 in the longitudinal direction. Furthermore, the protection plate 30 is provided with an ink introduction path 35 through which the ink introduction port 44 and a side wall of the reservoir 100 communicate with each other.

Such an inkjet recording head according to this embodiment takes in ink from the ink introducing port 44 connected with external ink supply means, which is not illustrated, and fills the interior ranging from the reservoir 100 through the nozzle orifices 21 with ink. Thereafter, the inkjet recording head applies a voltage between the lower electrode film 60 and each of the upper electrode films 80 corresponding to the pressure generating chambers 12, in accordance with recording signals from the drive circuit. Thus, the inkjet recording head distorts the elastic film 50, the insulation film 55, the lower electrode films 60 and the piezoelectric layers 70 with flexure. This distortion raises the pressure of each of the pressure generating chambers 12, and thereby ink droplets are ejected from the nozzle orifices 21.

Figure 4A:
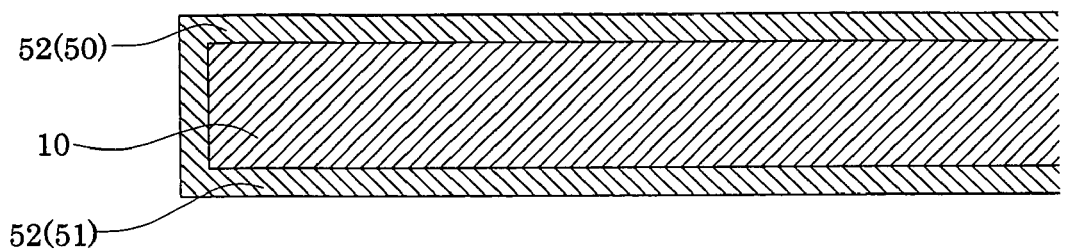
FIGS. 4A to 4C are cross-sectional views showing a method of manufacturing the recording head according to Embodiment 1 of the present invention.
Figure 4B:
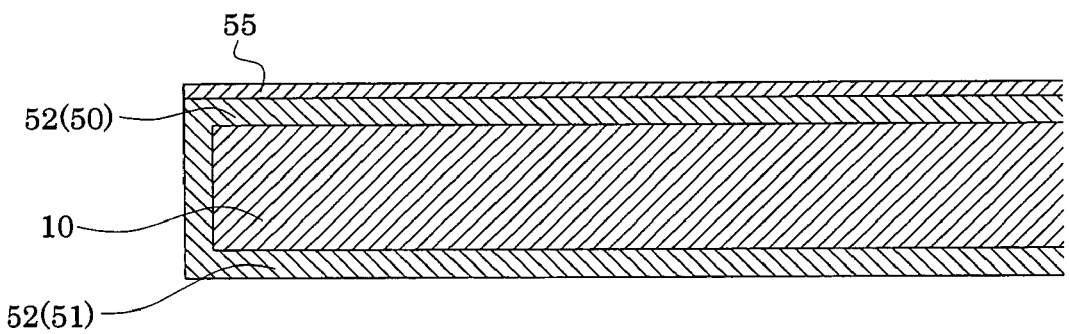

Hereinafter, descriptions will be provided for a method of manufacturing such an inkjet recording head with reference to FIGS. 4 to 6. Incidentally, FIGS. 4 to 6 are cross-sectional views of the pressure generating substrate 12 in the longitudinal direction. First of all, as shown in FIG. 4A, the passage-forming substrate 10 made of a single crystal silicon substrate is thermally oxidized in a diffusion furnace at approximately 1100° C. Thereby, a silicon dioxide 52 which will be later turned into the elastic film 50 and a protection film 51 is formed on the surfaces of the passage-forming substrate 10. Subsequently, as shown in FIG. 4B, a zirconium (Zr) layer is formed on top of the elastic film 50 (the silicon dioxide film 52). Thereafter, the insulation layer 55 made of zirconia ($ZrO_2$) is formed by means of thermally oxidizing the zirconium layer, for example, in the diffusion furnace at 500 to 1200° C.

Figure 4C:
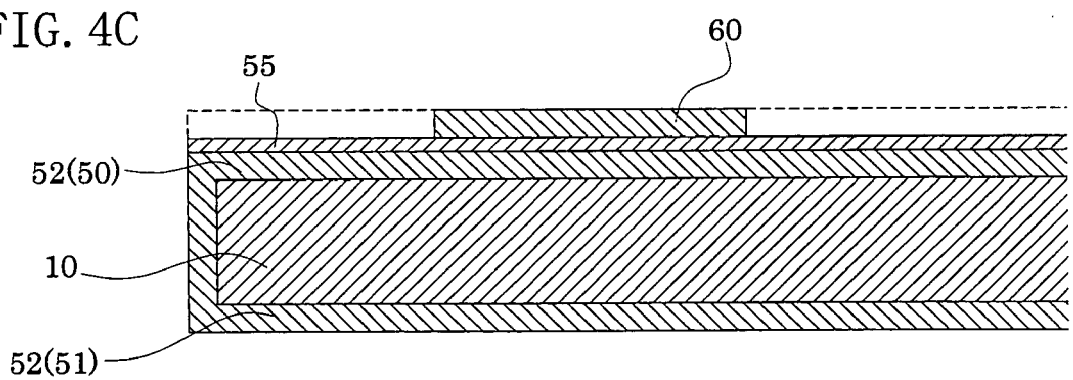

Next, as shown in FIG. 4C, the lower electrode film 60 made of iridium (Ir) is formed over the entire surface of the passage-forming substrate 10, and thereafter is patterned in the predetermined shapes.

Subsequently, the piezoelectric layer 70 made of lead-zirconate-titanate (PZT) is formed. In this respect, in the case of this embodiment, the piezoelectric layer 70 is formed by use of what is termed as the sol-gel method. In accordance with the sol-gel method, what is termed as sol is obtained by dissolving and dispersing a metal-organic substance in a catalytic agent. This sol is turned into gel by application and drying. Then, the gel is baked at a high temperature. Thereby, the piezoelectric layer 70 made of a metal-oxide substance is obtained. Incidentally, a material for the piezoelectric layer 70 is not limited to lead-zirconate-titanate. It does not matter whether another piezoelectric materials, for example, a relaxor ferroelectric (e.g. PMN-PT, PZN-PT, PNN-PT or the like) is used. In addition, the method of manufacturing the piezoelectric layer 70 is not limited to the sol-gel method. It does not matter whether, for example, the MOD (Metal-Organic Decomposition) method or the like is used.

Figure 5A:
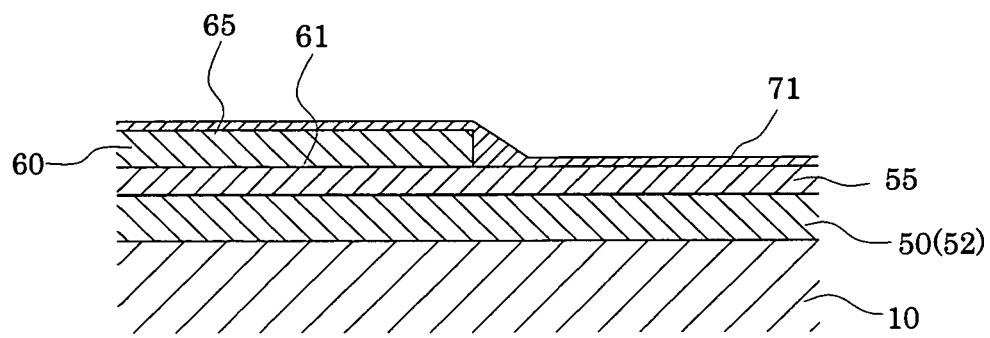
FIGS. 5A to 5C are cross-sectional views showing the method of manufacturing the recording head according to Embodiment 1 of the present invention.

A specific procedure of forming the piezoelectric layer 70 is as follows. First of all, a seed titanium (Ti) is formed on the lower electrode film 60, although the seed titanium (Ti) is not illustrated. Thereafter, as shown in FIG. 5A, a piezoelectric precursor film 71 is formed on top of the lower electrode film 60. The piezoelectric precursor film 71 is a PZT precursor film. In other words, the sol (liquid solution) containing the metal-organic substance is applied to the top of the lower electrode film 60 which has been formed above the passage-forming substrate 10 (in the applying step). Subsequently, this piezoelectric precursor film 71 is heated at a predetermined temperature, and thus is dried for a certain length of time. In the case of this embodiment, the piezoelectric precursor film 71 can be dried, for example, by means of keeping the piezoelectric precursor film 71 at 170-180° C. for 8 to 30 minutes. Furthermore, it is desirable that the rate of temperature rise in the drying step be 0.5 to 1.5° C./sec. Incidentally, the "rate of temperature rise," which has been referred to in this respect, is defined as a rate of change of temperature from Temperature 1 through Temperature 2 with respect to time. Temperatures 1 and 2 are calculated in the following manner. To begin with, the difference between a temperature (room temperature), at which the heating is started, and a temperature which the piezoelectric precursor film 70 reaches by the heating is obtained. Then, Temperature 1 is obtained by adding 20% of the difference to the temperature at which the heating is started. Temperature 2 is obtained by adding 80% of the difference to the temperature at which the heating is started. In a case where, for example, the temperature is raised from room temperature (25° C.) to 100° C. in 50 seconds, the rate of temperature rise is expressed with the following equation.

(100−25)×(0.8−0.2)/50=0.9[° C./sec]

Subsequently, the piezoelectric precursor film 71, which has been dried, is degreased by means of heating the piezoelectric precursor film 71 to a predetermined temperature and keeping the film at that temperature for a certain length of time. In the case of this embodiment, the piezoelectric precursor film 71 is degreased, for example, by means of heating the film to a temperature of approximately 300 to 400° C. and keeping the film at the temperature for approximately 10 to 30 minutes. Incidentally, the degreasing, which has been referred to in this respect, means to eliminate organic components contained in the piezoelectric precursor film 71 therefrom, for example, as $NO_2$, $CO_2$, $H_2O$ and the like. In the degreasing step, it is desirable that the rate of temperature rise be 0.5 to 1.5° C./sec.

Figure 5B:
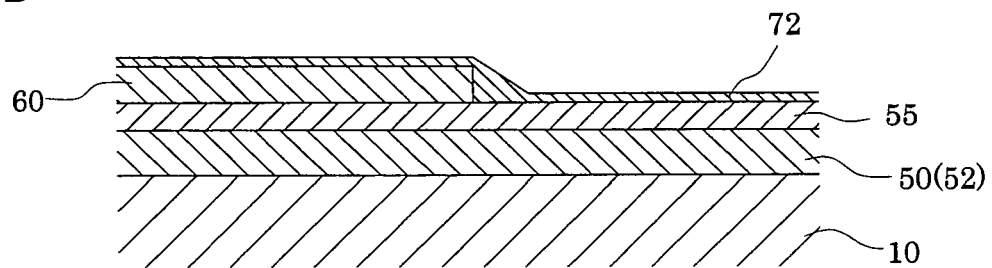

Then, the piezoelectric precursor film 71 is heated to a predetermined temperature, and is kept at the temperature for a certain length of time, and thus is crystallized. Accordingly, a piezoelectric film 72 is formed (in the baking step), as shown in FIG. 5B. In the baking step, it is desirable that the piezoelectric precursor film 71 be heated to a temperature of 680 to 900° C. In the case of this embodiment, the piezoelectric precursor film 71 is baked by means of heating the piezoelectric precursor film 71 at 680° C. for 5 to 30 minutes, and thus the piezoelectric layer 72 is formed. Moreover, in the baking step according to this embodiment, the rate of temperature rise is 120° C./sec.

It should be noted that, for example, an RTA (Rapid Thermal Annealing) system can be used as the heating system used for the drying, degreasing and baking steps. The RTA system performs the heating process by means of irradiation from a hot plate, a diffusion furnace or an infrared lamp. In this embodiment, the rate of temperature rise is as high as 120° C./sec. For this reason, the RTA system which can perform the baking process at such a high rate of temperature rise is used.

Likewise, in the case of this embodiment, as described above, the seed titanium (Ti), which is not illustrated, is formed on the lower electrode film 60. Thereafter, a piezoelectric film 72 is formed. Thereby, PZT is grown by using titanium crystals as cores. This causes crystals to grow from the lower electrode film 60, and accordingly makes it possible to obtain dense columnar crystals. Such a seed titanium (Ti) is diffused into the piezoelectric film 72 after baking.

Figure 5C:
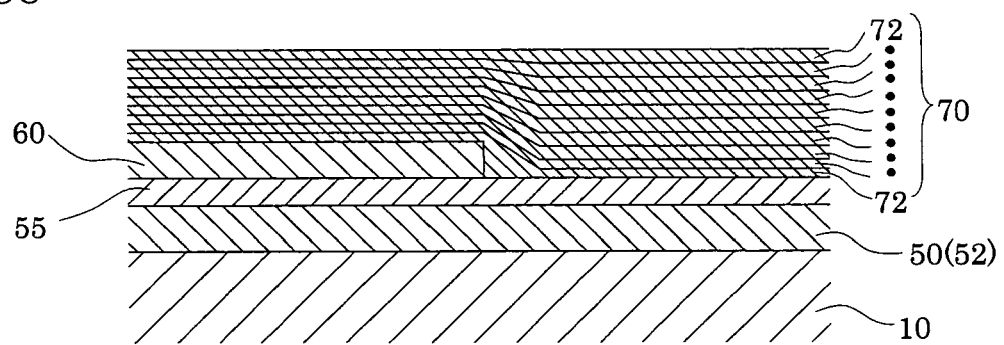

Then, the piezoelectric-layer forming step including the aforementioned applying, drying, degreasing and baking steps is repeated a plurality of times. In the case of this embodiment, the piezoelectric-layer forming step is repeated ten times. Thereby, the piezoelectric layer 70 is formed as shown in FIG. 5C. The piezoelectric layer 70 has a predetermined thickness, and includes ten piezoelectric films 72. In a case where, for example, the thickness of the sol which is applied each time is approximately 0.1 μm, the total film thickness of the piezoelectric layer 70 is approximately 1.1 μm.

Such a manufacturing method makes it possible to form a piezoelectric layer 70, in which the degree of orientation of the face surface is not less than 70%, and in which the degree of orientation of the vertical surface of orthogonal to the face surface is not less than 80%. Accordingly, this makes it possible for the piezoelectric layer 70 to exhibit excellent displacement characteristics.

Figure 6A:
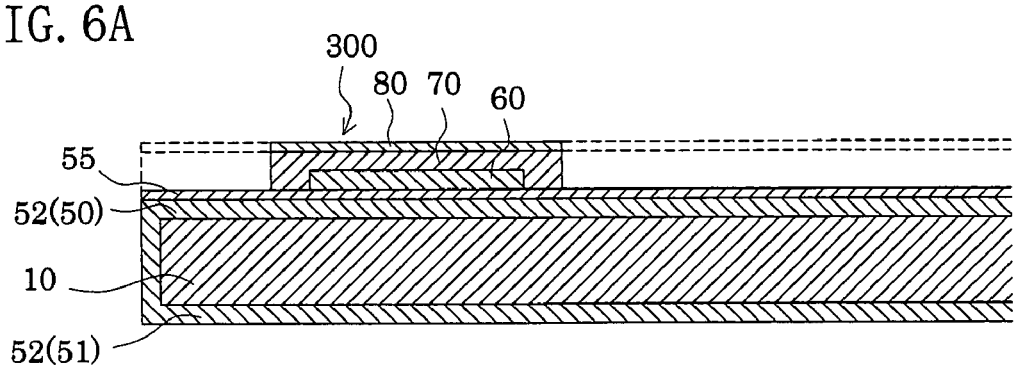
FIGS. 6A to 6D are cross-sectional views showing the method of manufacturing the recording head according to Embodiment 1 of the present invention.
Figure 6B:
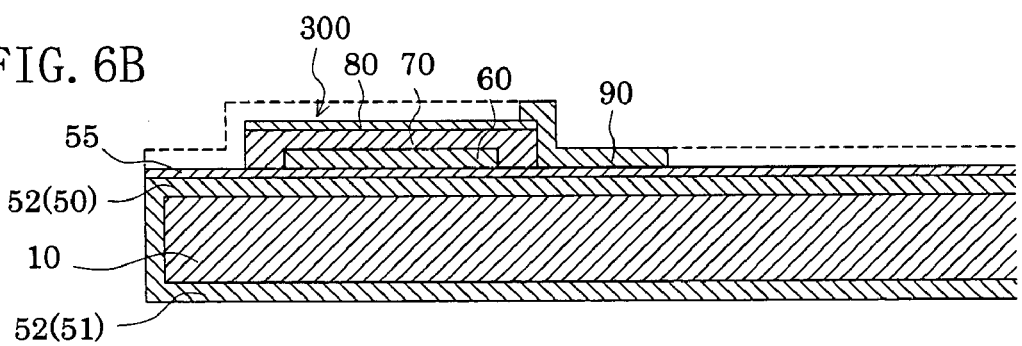

In addition, after the piezoelectric layer 70 is formed through the steps as shown in FIG. 5A to 5C, the upper electrode film 80 is formed above the entire surface of the passage-forming substrate 10, as shown in FIG. 6A. The upper electrode film 80 is made, for example, of iridium. Then, the piezoelectric layer 70 and the upper electrode film 80 are patterned in each of the regions respectively opposite the pressure generating chambers 12. Thus, the piezoelectric elements 300 are formed. Subsequently, the lead electrodes 90 are formed. Specifically, the lead electrodes 90 are formed in the following manner. First, a lead electrode 90 is formed over the entire surface of the passage-forming substrate 10 as shown in FIG. 6B. The lead electrode 90 is made, for example, of gold (Au) and the like. Thereafter, the lead electrode 90 is patterned in each of the piezoelectric elements 300 by use of a mask pattern (not illustrated) made, for example, of a resist or the like.

Figure 6C:
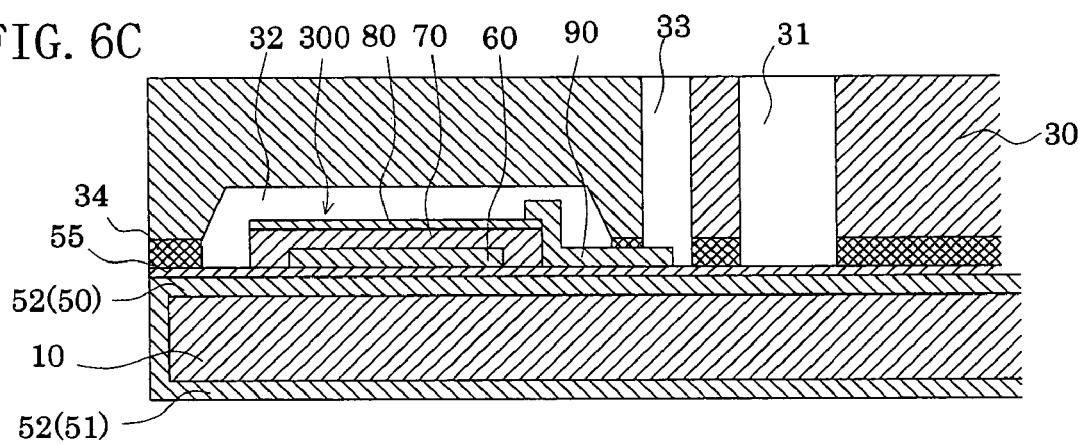

Next, as shown in FIG. 6C, the protection plate 30 is joined to the top of the passage-forming substrate 10, for example, with the adhesive agent 34. The protection plate 30 holds the plurality of piezoelectric elements 300 thus patterned. Incidentally, the reservoir portion 31, the piezoelectric element holing portion 32 and the like are beforehand formed in the protection plate 30. In addition, the protection plate 30 is made, for example, of a single crystal silicon substrate having a thickness of approximately 400 μm. The joining of the protection plate 30 to the passage-forming substrate 10 remarkably increases the rigidity of the resultant passage-forming substrate 10.

Figure 6D:
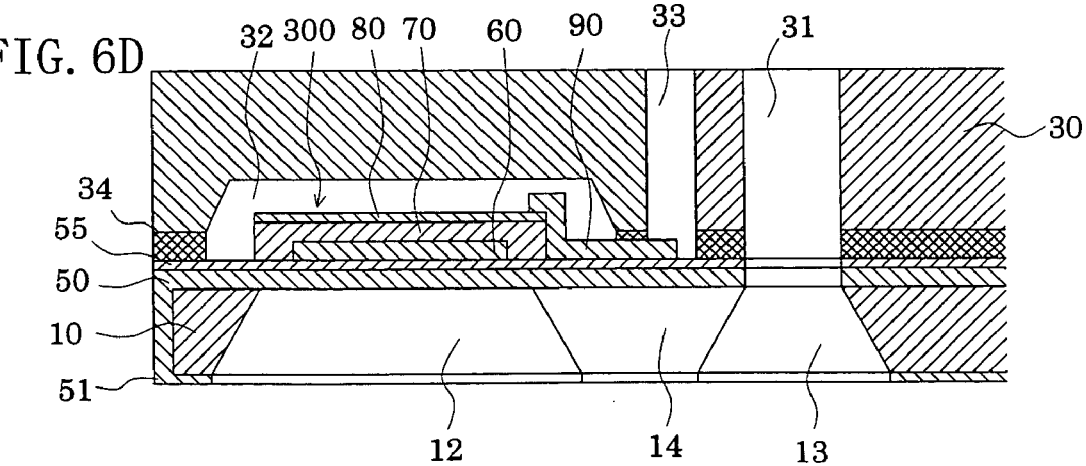

Subsequently, as shown in FIG. 6D, the protection film 51 is formed by means of patterning the silicon dioxide film 52 on a surface of the passage-forming substrate 10, into a predetermined shape, the surface being opposite the surface above which the piezoelectric elements 300 are formed. With the protection film 51 used as a mask, the passage-forming substrate 10 is caused to undergo an anisotropic etching (wet-etching) by use of an alkaline solution such as KOH. Thereby, the pressure-forming chambers 12, the communicating portion 13, the ink supply paths 14 and the like are formed in the passage-forming substrate 10.

Subsequently, the nozzle plate 20 is joined to a surface of the passage-forming substrate 10, which surface is opposite the surface to which the protection plate 30 has been joined, with the protection film 51 in between. The nozzle orifices 21 are drilled in the nozzle plate 20. Concurrently, the compliance plate 40 is joined to the protection plate 30. Thereby, the inkjet recording head as shown in FIG. 1 is formed.

It should be noted that a large number of chips are actually formed on a single wafer at a time through the aforementioned serial of film formation processes and anisotropic etching processes. After the processes are completed, the wafer is divided into passage-forming substrates 10 each in a chip size as shown in FIG. 1. Thus, the inkjet recording heads are formed.

EXAMPLE

A piezoelectric film made of lead-zirconate-titanate (PZT) was baked with a 120° C./sec rate of temperature rise by means of the RTA system. Four piezoelectric films were laminated over each other, and thereby a piezoelectric layer according to Example was formed.

Comparative Example 1

A piezoelectric film made of lead-zirconate-titanate (PZT) was baked with a 10° C./sec rate of temperature rise by means of the RTA system. Four piezoelectric films were laminated over each other, and thereby a piezoelectric layer according to Comparative Example 1 was formed.

Comparative Example 2

A piezoelectric film made of lead-zirconate-titanate (PZT) was baked with a 1° C./sec rate of temperature rise by means of the RTA system. Four piezoelectric films were laminated over each other, and thereby a piezoelectric layer according to Comparative Example 2 was formed.

Comparative Example 3

A piezoelectric film made of lead-zirconate-titanate (PZT) was baked with a 3° C./sec rate of temperature rise by means of the RTA system. Four piezoelectric films were laminated over each other, and thereby a piezoelectric layer according to Comparative Example 3 was formed.

Experimental Example

With regard to each of the piezoelectric layers according to Example and Comparative Examples 1 to 3, the degree of orientation of the face surface was measured by means of the wide-angled X-ray diffraction method in the same manner as the piezoelectric layer according to Embodiment 1 was measured. In addition, the degree of orientation of the vertical surface was measured by means of the in-plane X-ray diffraction method in the same manner as the piezoelectric layer according to Embodiment 1 was measured. Furthermore, the displacement constants respectively of the piezoelectric layers were measured. Table 1 as listed below shows results of these.

It is learned that, as shown in Table 1, the degree of orientation of the face surface was not less than 70% with regard to each of the piezoelectric layers according to Example and Comparative Examples 1 to 3. However, it is also learned that each of the piezoelectric layers according to Comparative Examples 1 to 3 was formed with the degree of orientation of the vertical surface which was less than 80%. In addition, it is learned that, even though the degree of orientation of the face surface of each of the piezoelectric layers according to Comparative Examples 1 to 3 was not less than 70%, the displacement constant, that is, displacement characteristics was deteriorated due to the degree of orientation of the vertical surface. As a result, it is learned that a piezoelectric layer, in which, like the piezoelectric layer according to Example, the degree of orientation of the face surface is not less than 70% and the degree of orientation of the vertical surface is not less than 80%, is excellent in displacement characteristics.

Likewise, if a piezoelectric layer is formed in a way that, like the piezoelectric element as recited in Example, the abundance ratio of the (100) planes of first type is not less than 10% of the sum of the (100) planes of second type and the (100) planes of first type, the displacement characteristics are improved. In this case, the (100) planes of first type are present in the vertical surface orthogonal to the face surface of the piezoelectric layer. The (100) planes of second type are present in the surface at the predetermined angle to the vertical surface orthogonal to the face surface of the piezoelectric layer.

Moreover, it is learned that, if the rate of temperature rise which is used while a piezoelectric layer is being baked is as high as 120° C./sec, this makes it possible to form a piezoelectric layer exhibiting excellent displacement characteristics like the piezoelectric layer according to Example.

Other Embodiments

The Embodiment 1 of the present invention has been described above. However, the basic configuration of the inkjet recording head is not limited to the aforementioned configuration. In the case of Embodiment 1, which has been described above, for example, after the piezoelectric precursor film 71 is applied, dried and degreased, the piezoelectric precursor film 71 is baked, and thus the piezoelectric film 72 is formed. However, the method of forming a piezoelectric layer 72 is not limited to this. It does not matter whether the piezoelectric film 72 is formed in the following manner. First, processes of applying, drying and degreasing a piezoelectric precursor film 71 are repeated several times, for example, twice. Thereafter, the piezoelectric precursor film 71 is baked. Thereby, the piezoelectric film 72 is formed.

TABLE 1

| | RATE OF TEMPERATURE RISE (° C./SEC) | (100) PLANE INTENSITY (cps) | DEGREE OF ORIENTATION OF FACE SURFACE (%) | DEGREE OF ORIENTATION OF VERTICAL SURFACE (%) | DISPLACEMENT CONSTANT (pC/N) |
|---|---|---|---|---|---|
| EXAMPLE | 120 | 446 | 86 | 87 | 157 |
| COMPARATIVE EXAMPLE 1 | 10 | 444 | 84 | 70 | 136 |
| COMPARATIVE EXAMPLE 2 | 1 | 387 | 84 | 78 | 144 |
| COMPARATIVE EXAMPLE 3 | 3 (DIFFUSION FURNACE) | 374 | 92 | 69 | 131 |

Furthermore, in the case of Embodiment 1, the lower electrode 60 is formed by patterning. Thereafter, the piezoelectric layer 70 is formed. However, for the convenience of fabricating devices, a first piezoelectric film may be formed on the lower electrode film, and thereafter the lower electrode film may be patterned along with the piezoelectric layer.

Likewise, in the case of Embodiment 1, iridium (Ir) is used as the material for the lower electrode film 60. However, the material is not particularly limited to this. For example, a conductive material essentially containing iridium (Ir) may be used as a material for the lower electrode film 60. Otherwise, the lower electrode film 60 may be formed by sequentially laminating iridium (Ir), platinum (Pt) and iridium (Ir) over one another.

Figure 7:
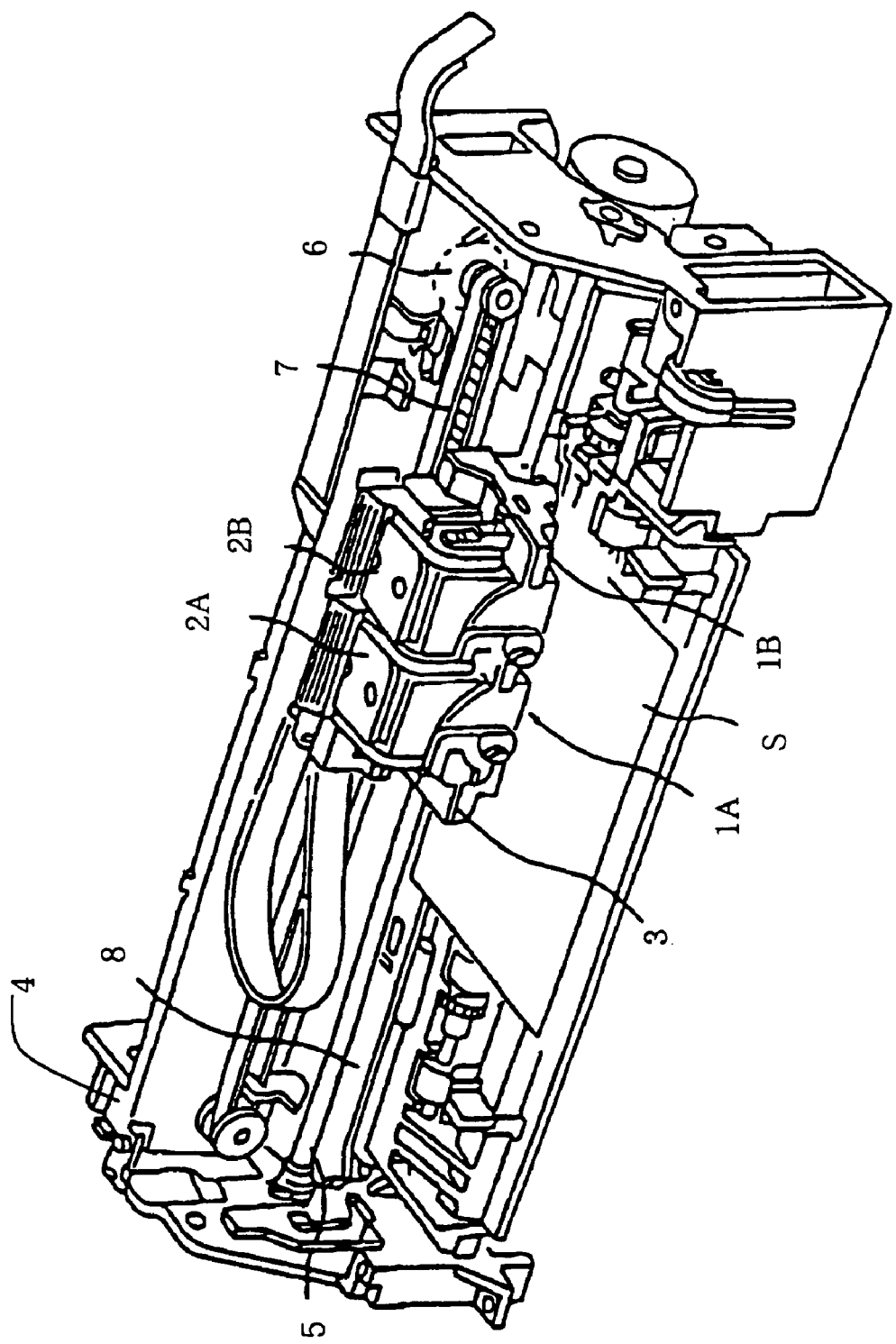
FIG. 7 is a diagram showing a schematic configuration of a recording apparatus according to an embodiment of the present invention.

In addition, the inkjet recording head according to each of those embodiments constitutes a part of a recording head unit provided with an ink passage communicating with an ink cartridge and the like, and is installed in an inkjet recording apparatus. FIG. 7 is a schematic diagram showing an example of the inkjet recording apparatus.

As shown in FIG. 7, recording head units 1A and 1B including the respective inkjet recording heads are detachably provided to cartridges 2A and 2B constituting ink supply means. A carriage 3 on which the recording head units 1A and 1B are mounted is provided to a carriage shaft 5 fixed to the apparatus main body 4 in a way that the carriage 3 can be freely moved in the direction in which the shaft extends. These recording head units 1A and 1B are assigned to ejecting black ink compositions and color ink compositions respectively.

In addition, a drive power from a drive motor is transmitted to the carriage 3 though a plurality of gears, which are not illustrated, and a timing belt 7. Thereby, the carriage 3 on which the recording head units 1A and 1B are mounted is caused to move along the carriage shaft 5. On the other hand, the apparatus main body 4 is provided with a platen 8 along the carriage shaft 5. A recording sheet S, which is a recording medium such as a sheet of paper, is designed to be transferred on the platen 8. The recording sheet S is fed by feed rollers and the like, although the feed rollers are not illustrated It should be noted that the present invention is intended to be widely applied to the entire range of liquid-jet heads, although Embodiment 1 has been described giving the inkjet recording head as an example of the liquid-jet heads. It goes without saying that the present invention can be applied to any liquid-jet head which ejects a liquid other than ink. Examples of a liquid-jet head which ejects a liquid other than ink include: various recording heads used for image recording apparatuses such as printers; color-material-jet heads used for manufacturing color filters of liquid crystal display devices and the like; electrode-material-jet heads used for forming electrodes of organic EL display devices, FED (Field Emission Display) devices and the like; bio-organic-substance-jet heads used for manufacturing bio-chips.

What is claimed is:

1. A piezoelectric element, comprising:
   a lower electrode;
   a piezoelectric layer; and
   an upper electrode,
   wherein a proportion of a peak diffraction intensity of a (100) plane present in a surface of the piezoelectric layer at the upper electrode side to a sum of peak diffraction intensities of (100), (110) and (111) planes present in the same surface is not less than 70%,
   wherein a proportion of a sum of peak diffraction intensities of (100), (110) and (210) planes present in a vertical surface orthogonal to the surface of the piezoelectric layer at the upper electrode side to a sum of peak diffraction intensities (100), (110), (210), (111) and (211) planes present in the same vertical surface is not less than 80%,
   wherein a proportion of a peak diffraction intensity of (100) planes of a first type is not less than 10% of a sum of peaks diffraction intensity of (100) planes of a second type and the (100) planes of the first type, and
   wherein the (100) planes of the first type are planes present in the vertical surface orthogonal to the surface of the piezoelectric layer at the upper electrode side, and the (100) planes of the second type are planes present in a surface at a predetermined angle to the vertical surface orthogonal to the face surface of the piezoelectric layer at the upper electrode side.

2. The piezoelectric element according to claim 1, wherein the piezoelectric layer is formed by laminating a plurality of piezoelectric films over each other.

3. The piezoelectric element according to claim 1, wherein the piezoelectric layer is made of lead-zirconate-titanate.

4. An actuator device, comprising the piezoelectric elements according to claim 1, the piezoelectric elements being provided on a substrate with a vibration plate between a group of the piezoelectric elements and the substrate.

5. An actuator device, comprising the piezoelectric elements according to claim 2, the piezoelectric elements being provided on a substrate with a vibration plate between a group of the piezoelectric elements and the substrate.

6. An actuator device, comprising the piezoelectric elements according to claim 3, the piezoelectric elements being provided on a substrate with a vibration plate between a group of the piezoelectric elements and the substrate.

7. A liquid-jet head, comprising the actuator device according to claim 4 as liquid-jet means which ejects a liquid from nozzle orifices.

8. A liquid-jet apparatus comprising the liquid-jet head according to claim 7.

* * * * *

UNITED STATES PATENT AND TRADEMARK OFFICE
CERTIFICATE OF CORRECTION

PATENT NO. : 7,651,199 B2
APPLICATION NO. : 11/390222
DATED : January 26, 2010
INVENTOR(S) : Takabe et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 734 days.

Signed and Sealed this

Twenty-eighth Day of December, 2010

David J. Kappos
*Director of the United States Patent and Trademark Office*